United States Patent [19]
Rush et al.

[11] Patent Number: 5,870,488
[45] Date of Patent: *Feb. 9, 1999

[54] METHOD AND APPARATUS FOR PREALIGNING WAFERS IN A WAFER SORTING SYSTEM

[75] Inventors: John M. Rush, Mountain View; J. Randolph Andrews, Campbell; Richard Collins, San Jose; Conor Patrick O'Carroll, Sunnyvale; David Ou, Mountain View, all of Calif.

[73] Assignee: Fortrend Engineering Corporation, Sunnyvale, Calif.

[ * ] Notice: The term of this patent shall not extend beyond the expiration date of Pat. No. 5,706,201.

[21] Appl. No.: 646,434
[22] Filed: May 7, 1996
[51] Int. Cl.⁶ .............................. G06K 9/00; G06K 9/36; G06F 19/00
[52] U.S. Cl. ..................... 382/151; 382/151; 382/287; 364/468.15
[58] Field of Search .................................... 382/151–153, 382/288, 287; 364/468.1, 468.15; 356/381–382, 357, 399–401; 250/560, 561, 548, 358.1; 414/416, 217–226, 618–619, 937, 941

[56] References Cited

U.S. PATENT DOCUMENTS

| | | |
|---|---|---|
| 4,695,729 | 9/1987 | Monno et al. ................. 250/358.1 |
| 4,794,648 | 12/1988 | Ayata et al. .................................. 382/8 |
| 4,819,167 | 4/1989 | Cheng et al. ....................... 364/167.01 |
| 4,974,245 | 11/1990 | Mioque et al. ............................. 378/54 |
| 5,225,691 | 7/1993 | Powers et al. ........................... 250/561 |
| 5,460,478 | 10/1995 | Akimoto et al. ........................ 414/786 |
| 5,706,201 | 1/1998 | Andrews ............................... 364/468.1 |

*Primary Examiner*—Jose L. Couso
*Assistant Examiner*—Duy M. Dang
*Attorney, Agent, or Firm*—The Kline Law Firm

[57] ABSTRACT

A wafer sorting system utilizing optical character recognition and optical "gate sensors" to determine the orientation of the wafers for prealigning. It is envisioned that the machine will be installed in conjunction with a computer controller and multiple cassette stations. A first end of a transfer arm of a robot is equipped with an end effector to transfer individual wafers. The end effector of the transfer arm is extendable and retractable to select and remove the desired wafer from its cassette, and to transfer it to the prealigner or a target cassette in its proper orientation. The end effector includes a vacuum pickup and a sensor that enables detection of presence or absence of wafers in the cassette, and any misaligned wafers in the cassette. Further gate sensors are mounted on the prealigner to accomplish the orientation function prior to the wafer being placed on the prealigner chuck. Multiple perimeter points are used to determine the position of the center of the wafer. The optical character recognition capability of the system then allows the individual wafers to be identified and to be sorted as desired.

2 Claims, 10 Drawing Sheets

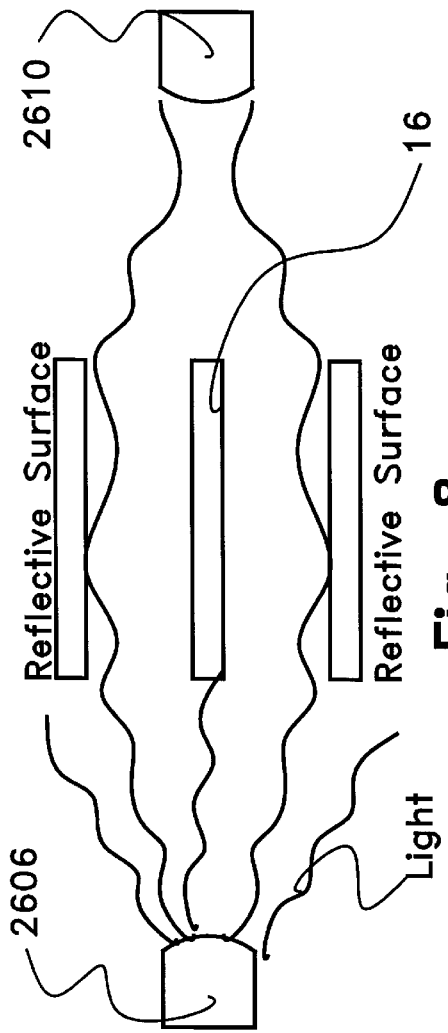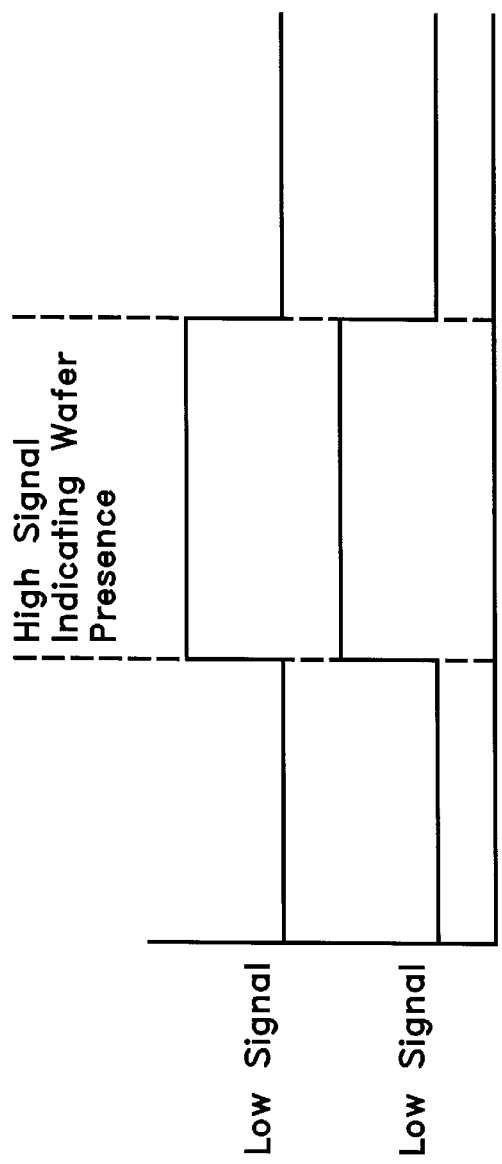

A=MEASURED VECTOR
B=MEASURED VECTOR
C=MAGNITUDE(A−B)/2,ANGLE(A−B)
D=MAGNITUDE(SQRT(RADIUS^2−MAGNITUDE(C)^2),ANGLE(C)+/−90
CENTER=B+C+D

# METHOD AND APPARATUS FOR PREALIGNING WAFERS IN A WAFER SORTING SYSTEM

FIELD OF THE INVENTION

The present invention relates generally to wafer handling devices, and more particularly is a robotic device able to sort and position wafers in an optical character recognition system.

BACKGROUND OF THE INVENTION

In the manufacture of integrated circuits, various processes are required to be performed on the silicon wafer that is the substrate of the chips. During manufacture, the wafer is processed from a circular substrate of silicon to a finished wafer containing multiple chips. Wafers are transported in carriers, termed boats or cassettes, to the various operations that are to be performed on the wafer.

Additionally, wafers within a given cassette sometimes need to be sorted as individual wafers as opposed to transporting the entire cassette of wafers. This requirement depends upon which operation is to be next performed on the wafer, or on what the disposition of a given wafer might be.

Any handling of the wafer gives rise to an increased possibility of damage, either by mishandling or by contamination. These factors reduce the yield of the manufacturing process, thereby increasing the cost of production of chips. In a business as competitive as the chip industry, any increase in production cost is highly undesirable.

Therefore, there have been many efforts in the industry to address the problems inherent in handling and sorting wafers. The current state of the art for sorting individual wafers is to use a prealigner to determine the orientation of the wafer, and to then properly position the wafer. Prealigners currently available generally assume that the wafer will be placed on a chuck in a non-centered position. The wafer is spun to determine its eccentricity, and then repositioned in a centered orientation. This method of operation is not only fairly complex, but also requires a two-stage positioning operation. An example of this type of operation is U.S. Pat. No. 5,238,354, issued Aug. 24, 1993 to Volovich for "Semiconductor Object PreAligning Apparatus".

Another method of prealignment is to map the position of the wafer in its non-centered orientation, then use that map to drive an independent positioning means to position the wafer. This allows the user to position the wafer without loading it into the prealigner twice, but does require the independent positioning means. This greatly complicates the positioning operation. This method is exemplified by U.S. Pat. No. 5,308,222, issued May 3, 1994, to Bacchi et al, for "Noncentering Specimen Prealigner".

OBJECTS, SUMMARY, AND ADVANTAGES OF THE INVENTION

Accordingly, It is an object of the present invention to construct a wafer sorting device so as to minimize wafer damage and contamination.

It is another object of the present invention to provide a means of prealignment that requires only one placement on a rotational chuck.

It is a further object of the present invention to allow the user to orient the wafers in the cassette to any degree of rotation chosen by the user.

In summary, the present invention is a wafer sorting system utilizing optical character recognition and optical "gate sensors" to determine the orientation of the wafers for prealigning. It is envisioned that the machine will be installed in conjunction with a computer controller and multiple cassette stations. A first end of a transfer arm of a robot is equipped with an end effector to transfer individual wafers. The end effector of the transfer arm is extendable and retractable to select and remove the desired wafer from its cassette, and to transfer it to the prealigner or a target cassette in its proper orientation. The end effector includes a vacuum pickup and a sensor that enables detection of the presence or absence of wafers in the cassette, and any misaligned wafers in the cassette. Further, multiple gate sensors are mounted on the prealigner to accomplish the orientation function prior to the wafer being placed on the prealigner chuck. The gate sensors provide a plurality of data points which are used to determine the position of the center of the wafer. The optical character recognition capability of the system then allows the individual wafers to be identified and to be sorted as desired.

An advantage of the present invention is the wafers are centered and positioned for the notch or flat finding operation without being released form the transfer arm, thereby greatly increasing throughput.

A further advantage of the present invention is that manual handling of the wafers is eliminated for the sorting process, thus reducing wafer damage and contamination.

These and other objects and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 8 is a schematic representation of a false read caused by incident light in a light sensing system.

FIG. 9 depicts the operation of the gate sensors in the prealigner.

BEST MODE OF CARRYING OUT THE INVENTION

Figure 1:
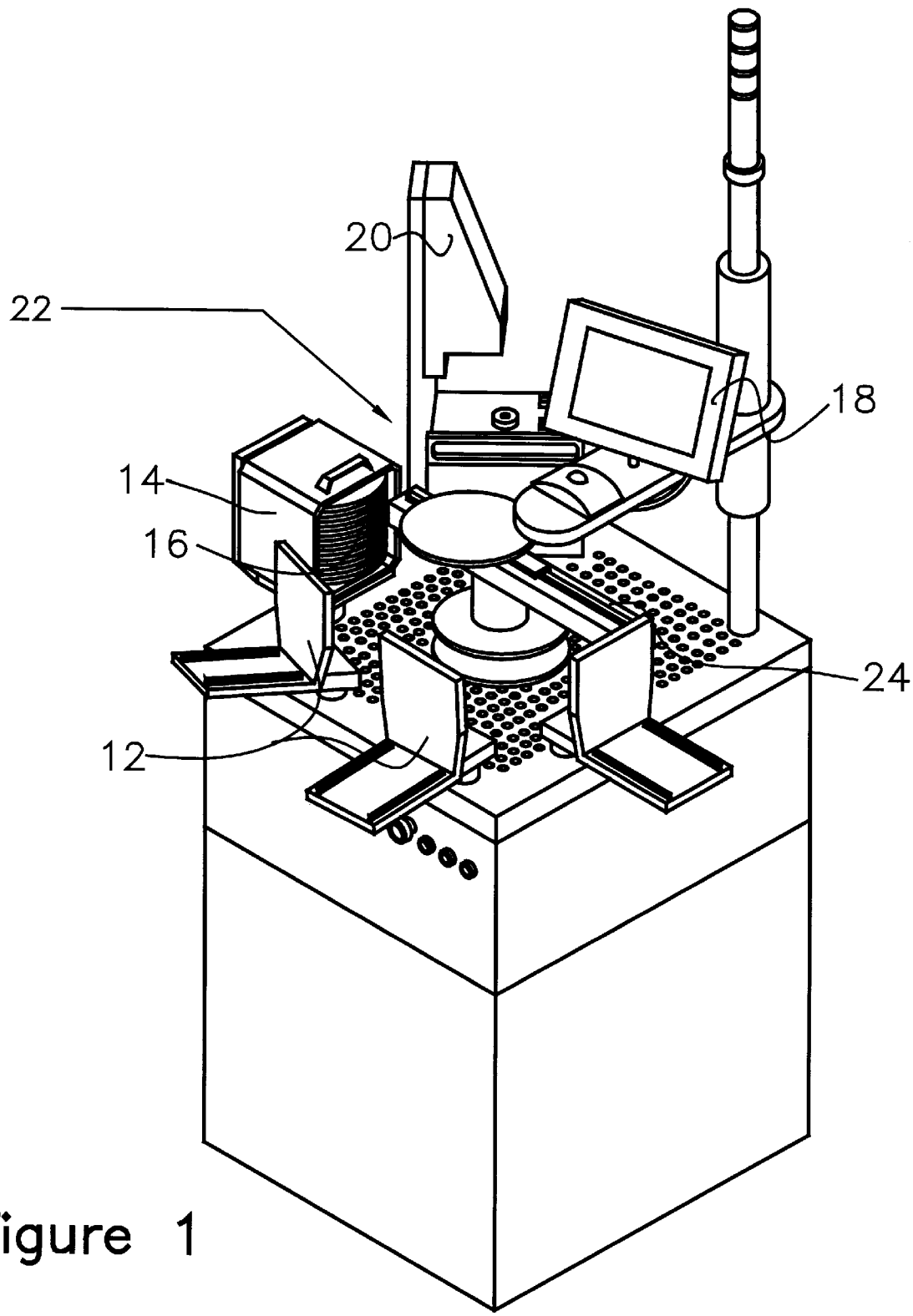
FIG. 1 is a perspective view of the wafer sorting system of the present invention.

Referring first chiefly to FIG. 1, the present invention is a wafer sorting system 10 utilizing an optical character recognition system. The device includes multiple cassette stations 12 that receive cassettes or boats 14 for wafers 16. A computer controller 18 allows a user to direct the sorting and placement of the individual wafers 16. An OCR camera 20 is utilized in conjunction with a prealigner 22 to inventory the wafers 16.

A robot 24 accomplishes the sorting or moving of the wafers or cassettes. An operator programs the robot 24 via the computer 18 to perform whatever sorting or transfer function is desired. The keyboard and CPU of the computer 18 can be mounted wherever it is most convenient for the user. The screen is pivotable to minimize required storage space.

Figure 2:
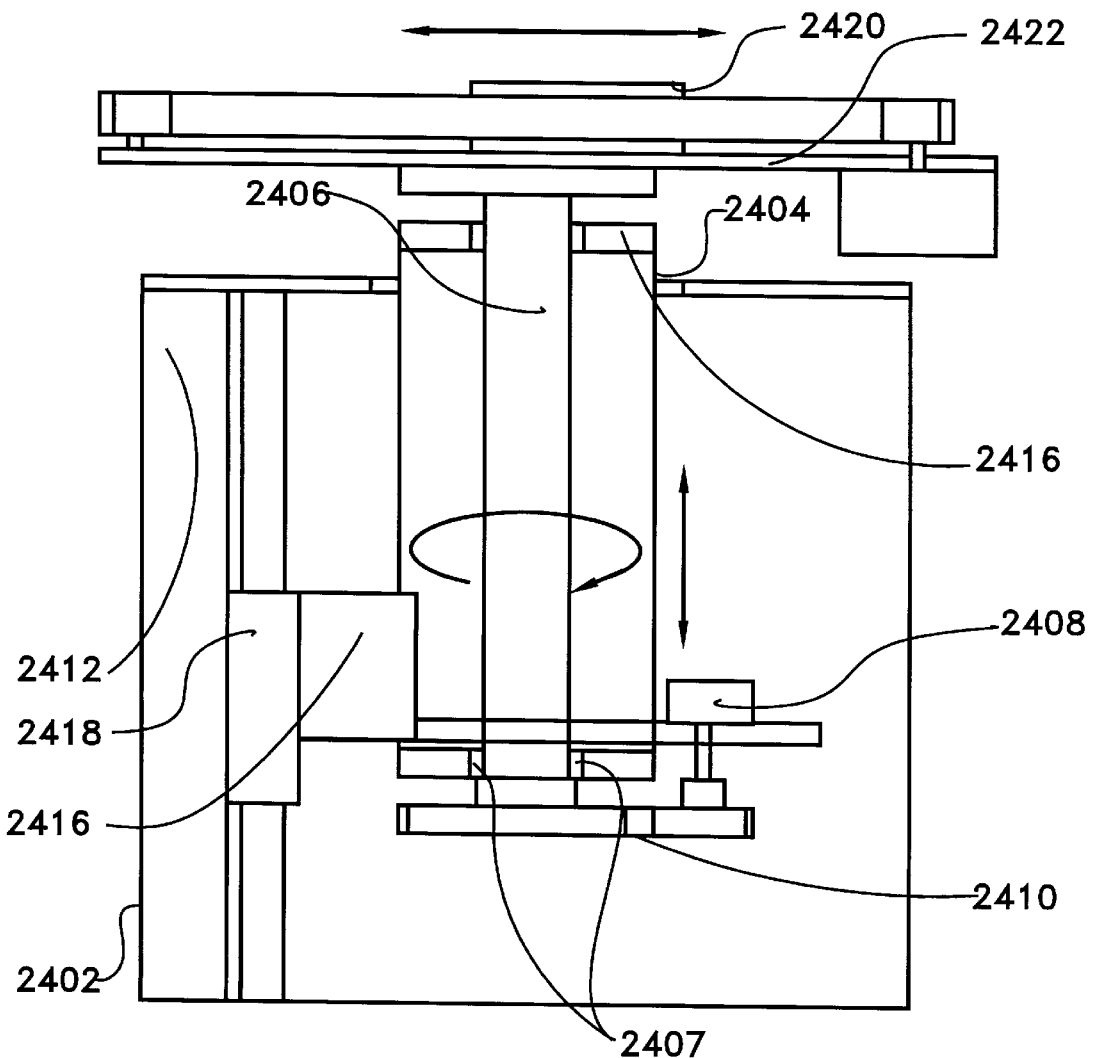
FIG. 2 is a side view of the robot locomotion mechanism.

The general construction of the means for locomotion of the robot 24 is illustrated in FIG. 2. The robot 24 is contained in a base 2402. The base 2402 encloses the raising/lowering and rotating means of the robot 24 so that the wafers handled are not exposed to any particulate contamination generated by the movement of the robot 24.

The rotation means includes a fixed outer housing 2404 secured within the base 2402. The outer housing 2404 encloses a hollow (to accommodate control wiring) rotating shaft 2406 which turns on ball bearings 2407 located at its upper and lower ends. The rotating shaft 2406 is in communication with the robot arm 14. Rotation of the arm 14 is powered by a rotation motor 2408 with a timing belt 2410 which is in communication with the rotating shaft 2406.

Raising and lowering of the arm 14 is accomplished by travel along a linear bearing consisting of a rail 2412 and a carriage 2418. The linear bearing is utilized to eliminate any shimmy in the system to ensure reproducibilty of the travel path of the arm 14. Connecting bars 2416 secure the carriage 2418 to the outer housing 2404. The powering means for vertical travel is a lead screw (not shown).

Extension and retraction of the robot 24 is accomplished by means of a sliding carriage 2420. The carriage 2420 moves along a linear guide 2422. Linear motion is powered by a stepper or servo motor in communication with the carriage 2420 via a timing belt.

Figure 3:
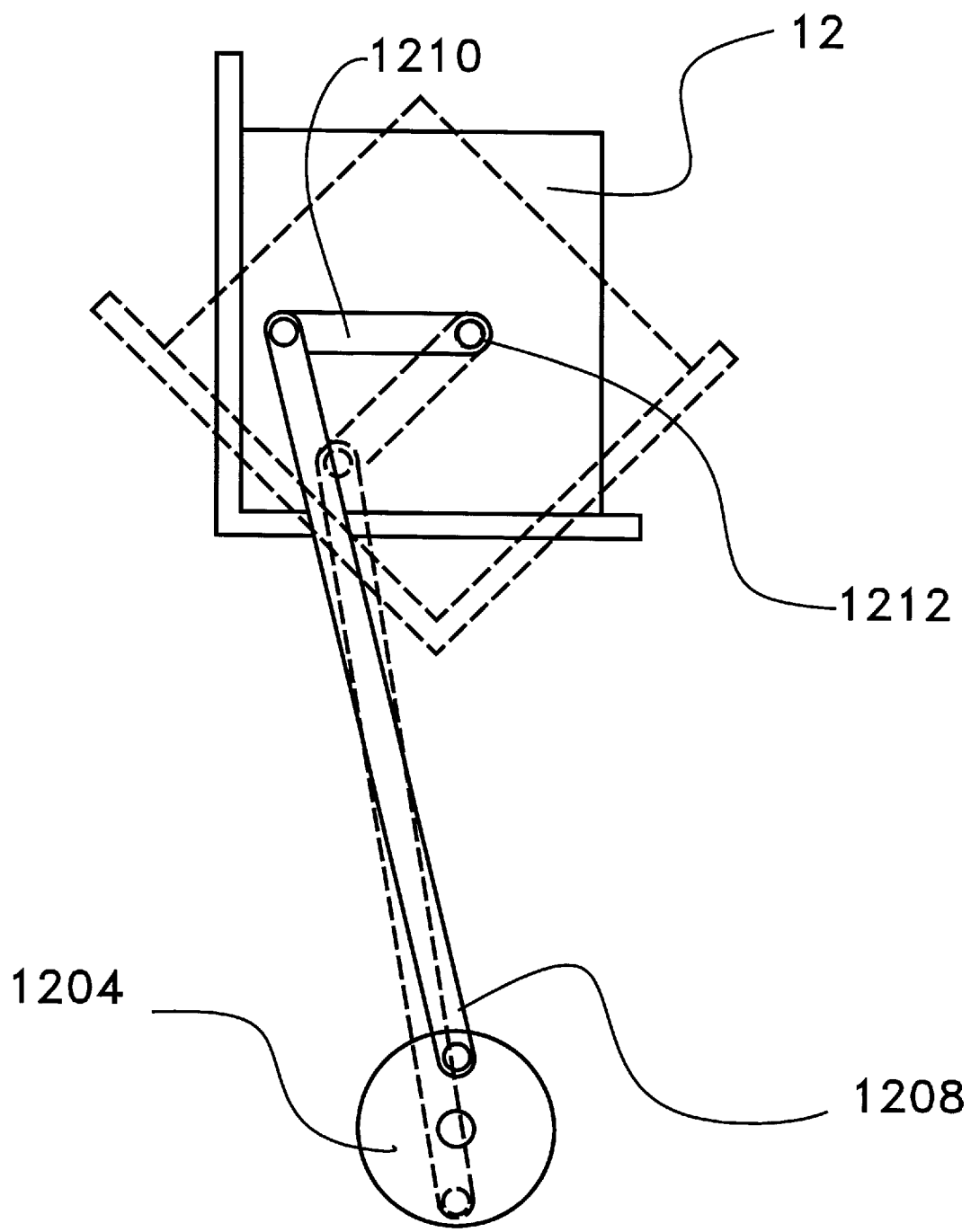
FIG. 3 is a side view of the cassette tilting mechanism.

The mechanism used to accomplish the tilting of the cassette stations 12 so that the wafers 16 are moved from a vertical to a horizontal orientation, and vice versa, is shown in FIG. 3. The position in which the cassettes are generally introduced to the system 10, with wafers nearly vertical, is shown in solid lines. The position for individual wafer handling, with the wafers horizontal, is shown in phantom.

A support column (not shown) contains the moving parts of the tilting mechanism, again to reduce the danger of particulate contamination. Power is supplied by means of a motor driven crank 1204 attached to the column. An adjustable push rod 1208 connects the motor driven crank 1204 to the cassette tilt crank 1210. The cassette tilt crank 1210 is a bar pivotally connected to the push rod 1208 and secured to the cassette station 12 at a pivot point 1212.

To move a cassette to the position shown in phantom, the motor driven crank 1204 rotates from top dead center to bottom dead center, moving the push rod 1208 and causing the crank 1210 to pivot about pivot point 1212. This causes the cassette station to be tilted from its upright position to the position shown in phantom. (The motor driven crank 1204 stops at top dead center and bottom dead center only to provide gradual acceleration and deceleration at the ends of the travel path.)

Figure 4:
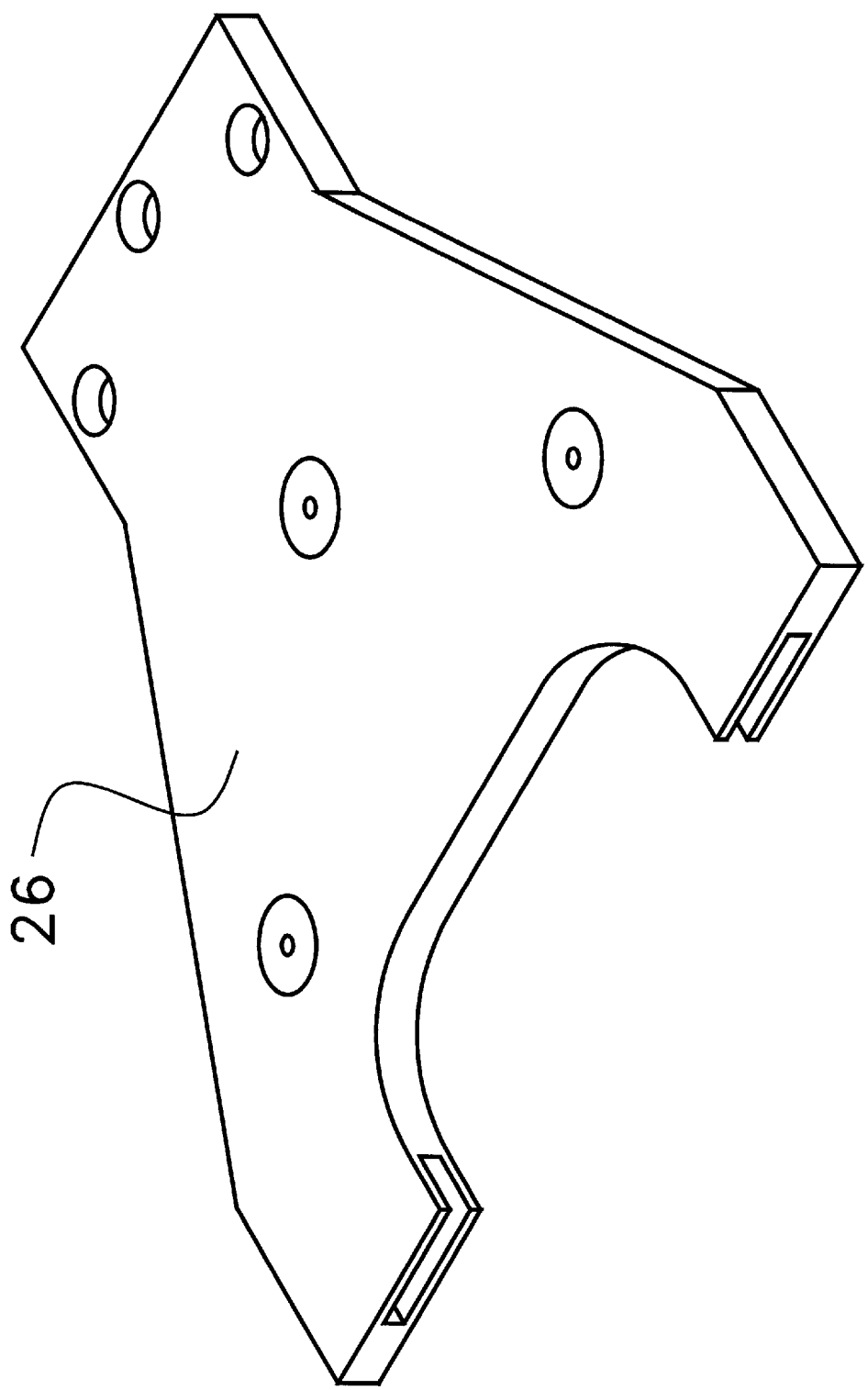
FIG. 4 is a top view of the end effector.
Figure 5:
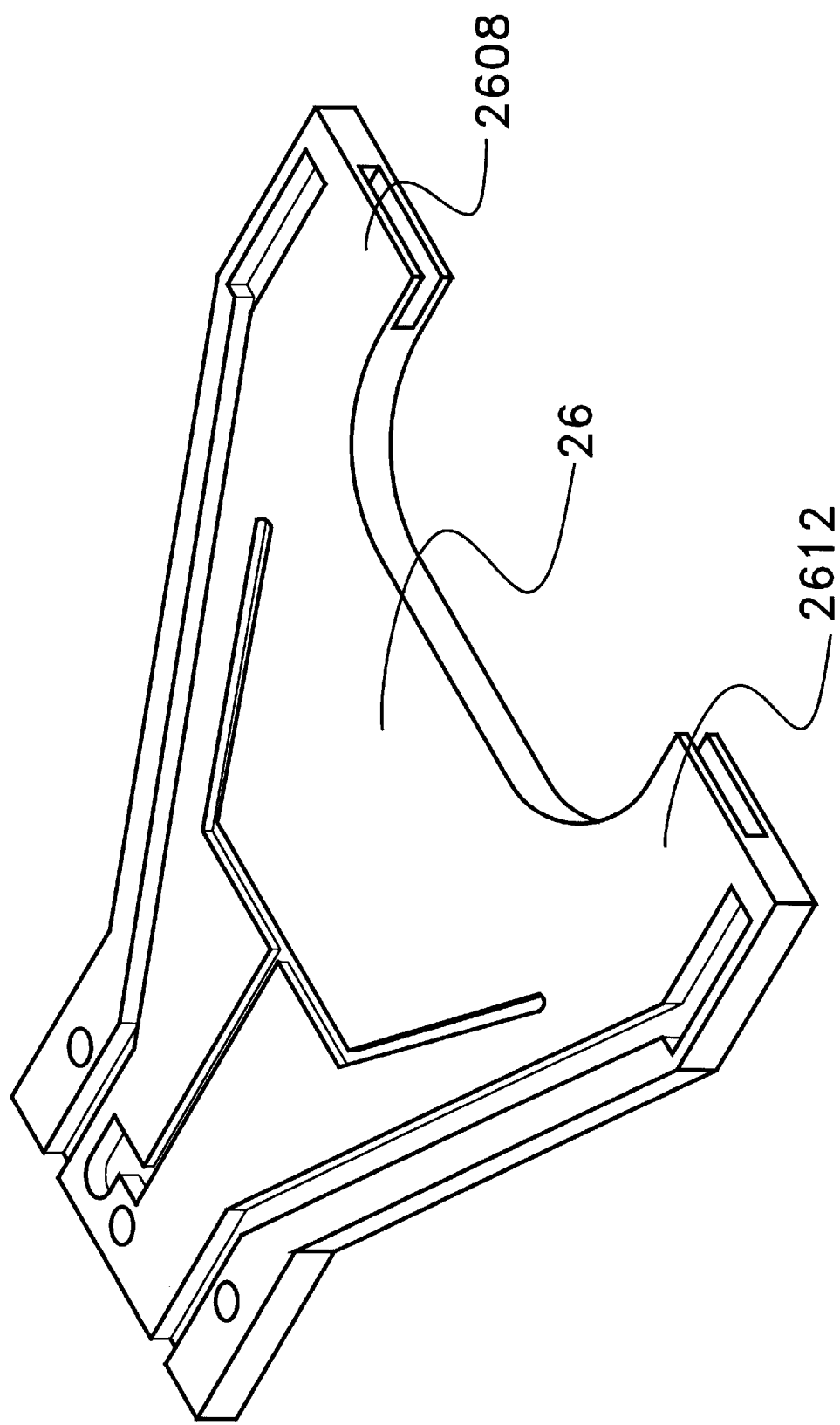
FIG. 5 is a bottom view of the end effector.
Figure 6:
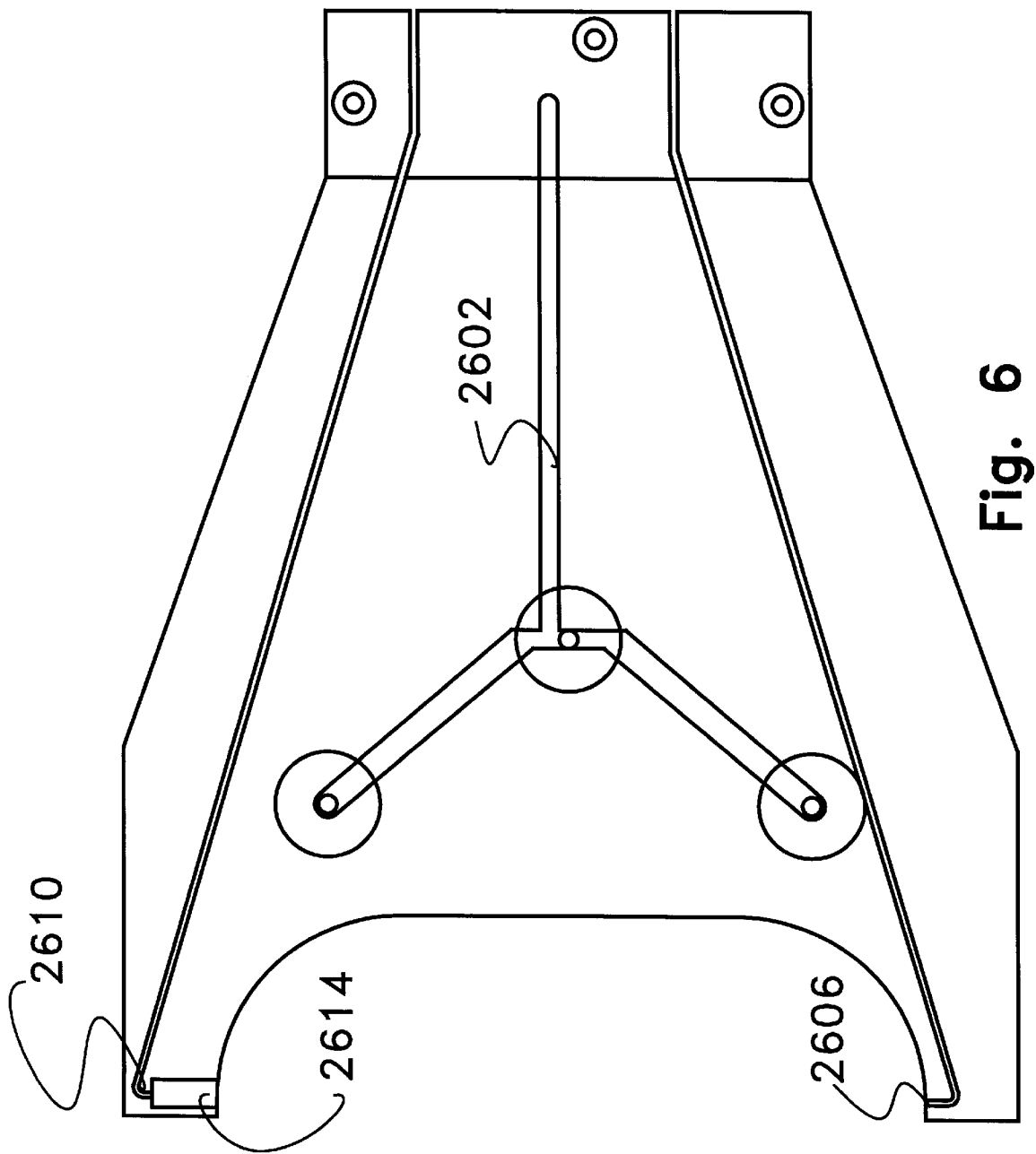
FIG. 6 is a cutaway view of the end effector showing the sensing elements.

An end effector 26 (See FIGS. 4–6) is utilized to scan the positions of the wafers 16, and to secure them in the robot 24. The end effector 26 includes a vacuum pickup means 2602 that secures the wafer. The end effector 26 further includes a sensing means. In a preferred embodiment, the sensing means is a fiber optic system. A collimator 2606 situated in a first fork tine 2608 of the end effector 26 transmits a light beam that is collected by a receiver 2610 in a second fork tine 2612 of the end effector 26. A rectangular aperture 2614 is utilized to direct the light to the receiver 2610. The aperture 2614 serves to reduce the possibility of reflected light masking the presence of a wafer 16.

As illustrated in FIG. 8, incident energy can sometimes cause the presence of a wafer 16 to be masked in ordinary light beam detectors. The light emitted from a light source tends to spread to a cone pattern as it travels from the source. This can allow light to travel around the wafer 16 and-to be reflected off of neighboring wafers or other reflective surfaces. The reflected light can rebound to the detector and complete the light path as if no wafer were present. This leads to a false read indicating no wafer presence.

Figure 7:
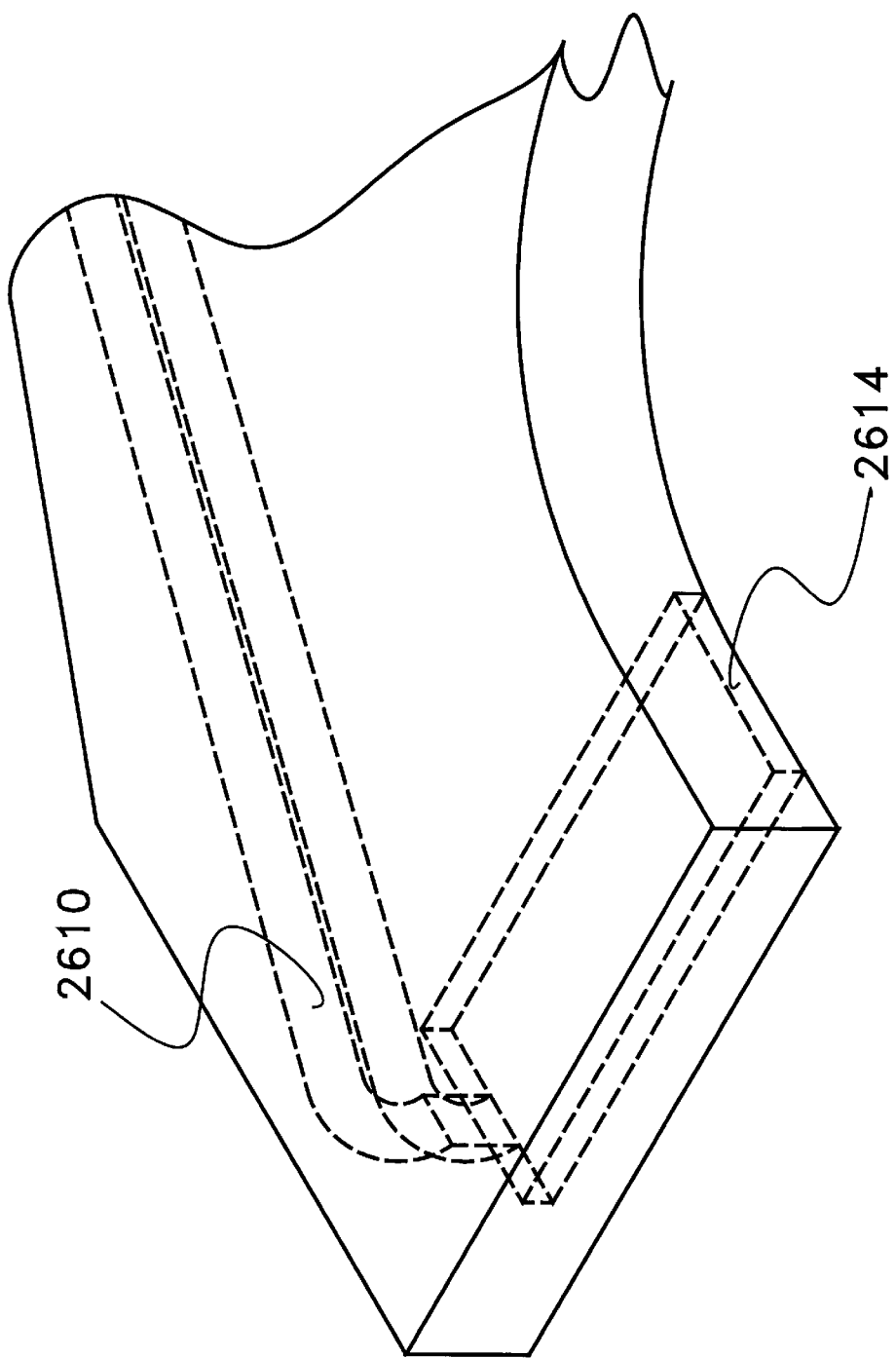
FIG. 7 is a detail view of the rectangular aperture.

The aperture 2614 of the present invention eliminates this problem by narrowing the field in which light is received. See FIG. 7. The aperture 2614 provides a hood for the receiver 2610 so that only "straight line" light is detected. It is therefore impossible for incident light to complete the path between the light source and the receiver. False "no wafer" reads are thereby eliminated.

Figure 10:
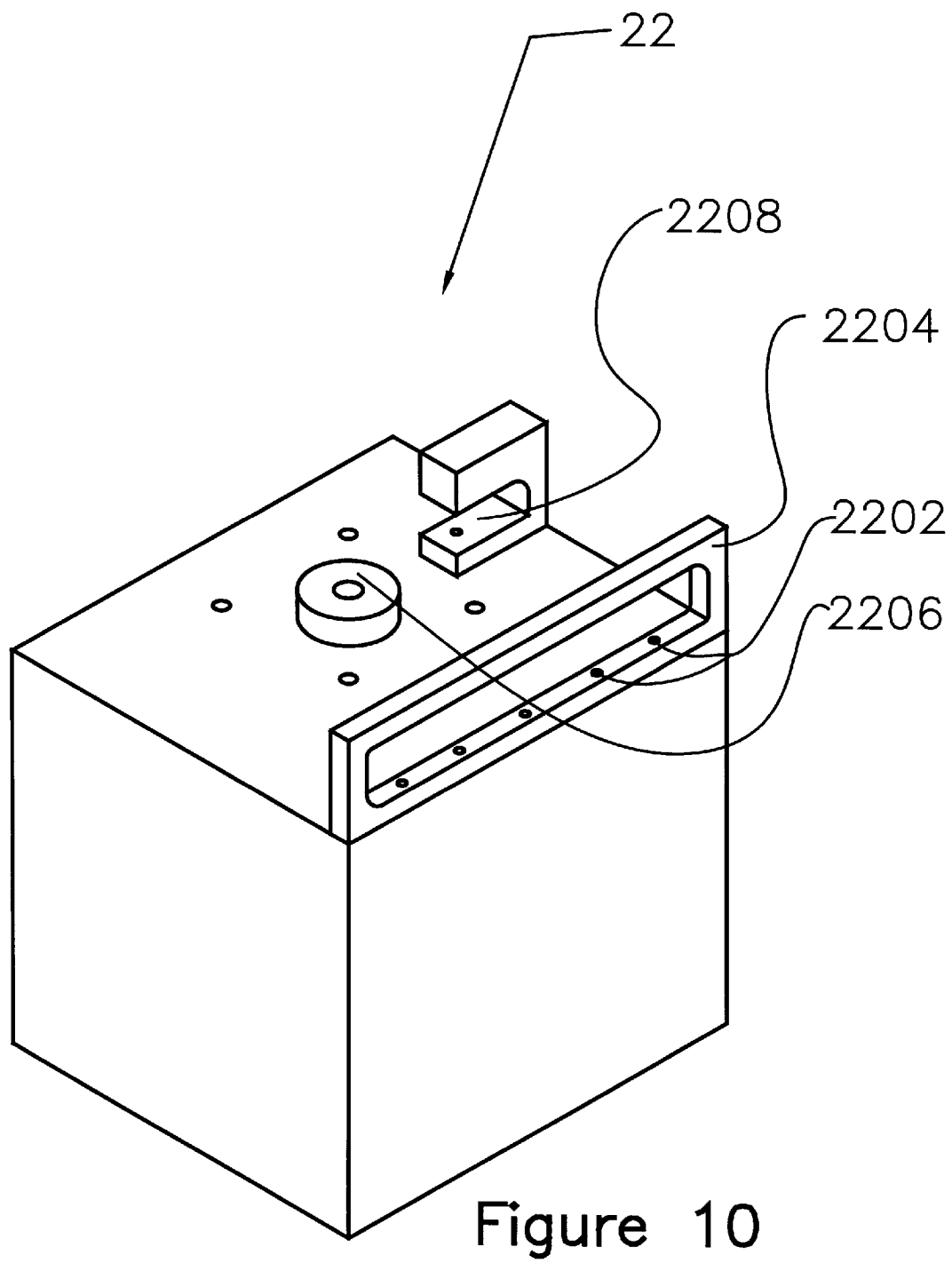
FIG. 10 is a perspective view of the prealigner.
Figure 11:
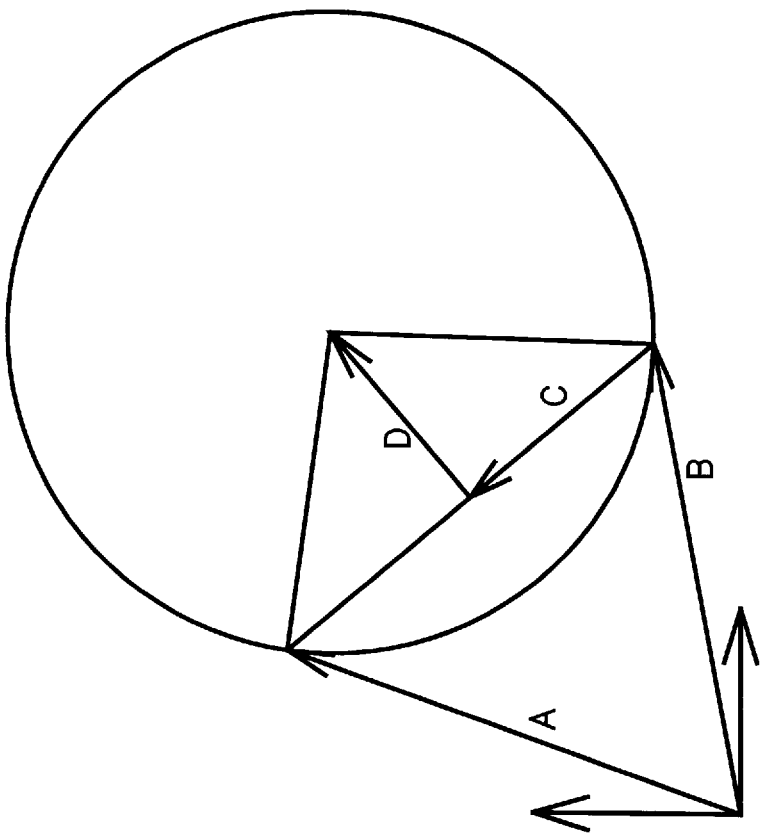
FIG. 11 is a graphical depiction of the method of calculating a center point.

Referring now to FIG. 10, the prealigner 22 is equipped with a plurality of through beam optical sensors termed gate sensors. The gate sensors 2202 are contained in a sensor housing 2204. As the robot 24 moves a wafer through the gate sensors 2202, the profile of the wafer is "tracked" by the sensors.

In the preferred embodiment, the number of sensors 2202 utilized is five. Multiple sensors are used so that the position of the flat or the notch on a wafer can be accounted for, while determining the true position of the center of the wafer, so that it can be appropriately placed by the robot.

The determination of the position of the center of the wafers is performed through a series of mathematical calculations. Data from the sensors 2202 is fed to the computer 18 which uses an algorithm established by the inventors to determine which points are on the edge, and which points are in the flat or notch. The sensors 2202 each provide two pieces of data as the wafer passes through them—the position of a leading edge and the position of a trailing edge. The pseudo code and the code for the algorithms that perform the position calculations are appended hereto.

The calculations are essentially as follows: the computer first groups the data points into non-adjacent pairs. The pairs are chosen so that they are approximately 90° apart. This provides the optimal calculation value for the points. The computer then selects in sequence each non-adjacent pair of data points, calculating a candidate center point based on each said non-adjacent pair. The candidate center point is scored by comparing a radius of the wafer to the distances from said candidate center point to the remaining non-adjacent pairs of data points. Candidate center points that score low are rejected. To reduce the effect any one data point can have on the calculated center, all the center points calculated from non-rejected pairs are averaged.

The theory of the calculations is that for a given proposed center point, the sensed edge points should be a wafer radius away from the calculated center. If this is not true, then the program recognizes that the points used for the original center point calculation were not on the circumference, and eliminates those points from the set of points on the circumference. When there are no non-circumference points remaining, multiple center point calculations are performed and then averaged in order to determine the true position of the center of the wafer. The computer 18 then uses that information to position the wafer accurately on the vacuum chuck 2206 in the prealigner.

To inventory the wafers, the OCR camera 20 must be able to focus on the OCR data on the wafer. This requires determining the position of the notch or flat after the wafer is mounted on the chuck 2206 of the prealigner 22. The prealigner 22 spins the wafer one revolution on the chuck 2206. This allows another optical sensor, a notch finder 2208, to determine the position of the flat or notch. The through beam of the notch finder is monitored during the revolution of the wafer, and the position of the notch is determined by recording the points at which the beam is unbroken. The wafer is then rotated until its radial position is such that the OCR data is aligned with the OCR camera 20.

Thus, the wafer sorting system of the present invention can establish a complete inventory of the wafers with a single spinning operation on the prealigner. By using the gate sensors 2202 to determine the x-y position of the wafers, the wafers are always concentrically placed on the chuck 2206. A single revolution can then determine the angular positioning of the wafer, allowing the OCR camera 20 to retrieve all required inventory data.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A wafer sorting machine comprising:

at least one cassette station to receive a cassette containing wafers, a robot to remove selected individual wafers from said cassette, a controlling computer, and a prealigner, wherein;

said prealigner includes a plurality of gate sensors positioned so that said robot passes each said individual wafer through said gate sensors, each of said gate sensors provides data points indicating a position of a leading edge of said individual wafer and a position of a trailing edge of said individual wafer, said computer processes said data points to determine a center point of said individual wafer and moves said robot to place said individual wafer so that said individual wafer is properly centered, said robot includes an end effector to pick up said individual wafers, said end effector includes a sensing means to determine the presence of said individual wafers, said sensing means includes a collimator in a first fork of said end effector to transmit a light beam that is collected by a receiver in a second fork of said end effector, a rectangular aperture in said second fork extends away from said receiver toward said collimator to shield said receiver from reflected light such that said collector receives only light traveling in a direct linear path from said collimator.

2. A wafer sorting machine comprising:

at least one cassette station to receive a cassette containing wafers, a robot to remove selected individual wafers from said cassette, a controlling computer, and a prealigner, wherein;

said prealigner includes a plurality of gate sensors positioned so that said robot passes each said individual wafer through said gate sensors, each of said gate sensors provides data points indicating a position of a leading edge of said individual wafer and a position of a trailing edge of said individual wafer, said computer processes said data points to determine a center point of said individual wafer and moves said robot to place said individual wafer so that said individual wafer is properly centered, said computer determines a center point of said individual wafer by grouping said data points into non-adjacent pairs, selecting in sequence each non-adjacent pair of data points, calculating a candidate center point based on each said non-adjacent pair, scoring said candidate center point by comparing a radius of said wafer to distances from said candidate center point to all non-adjacent pairs of data points that were not chosen for calculating said candidate center point, rejecting candidate center points that do not score well, and averaging remaining candidate center positions.

* * * * *